(12) United States Patent
Chang et al.

(10) Patent No.: US 11,408,720 B2
(45) Date of Patent: Aug. 9, 2022

(54) DEVICE AND METHOD FOR MEASURING THICKNESS OF DIELECTRIC LAYER IN CIRCUIT BOARD

(71) Applicant: Unimicron Technology Corporation, Taoyuan (TW)

(72) Inventors: Cheng-Jui Chang, Taoyuan (TW); Hung-Lin Chang, Taoyuan (TW); Jeng-Wey Chiang, Taoyuan (TW)

(73) Assignee: Unimicron Technology Corporation, Taoyuan (TW)

( * ) Notice: Subject to any disclaimer, the term of this patent is extended or adjusted under 35 U.S.C. 154(b) by 0 days.

(21) Appl. No.: 17/209,738

(22) Filed: Mar. 23, 2021

(65) Prior Publication Data

US 2022/0221262 A1 Jul. 14, 2022

(30) Foreign Application Priority Data

Jan. 14, 2021 (TW) .................................. 110101468

(51) Int. Cl.
*G01B 7/06* (2006.01)
*G01R 1/067* (2006.01)
*G01B 7/00* (2006.01)

(52) U.S. Cl.
CPC .............. *G01B 7/08* (2013.01); *G01B 7/002* (2013.01); *G01R 1/0675* (2013.01)

(58) Field of Classification Search
CPC ... G01B 7/08; G01B 7/02; G01B 7/04; G01B 7/042; G01B 7/044; G01B 7/048; G01B 7/06; G01B 7/082; G01B 7/085; G01B 7/087; G01B 7/002; G01R 1/0675
See application file for complete search history.

(56) References Cited

U.S. PATENT DOCUMENTS

| | | | |
|---|---|---|---|
| 6,977,498 B2 | 12/2005 | Scherzinger et al. | |
| 11,204,242 B2 | 12/2021 | Kang et al. | |
| 2009/0015266 A1* | 1/2009 | Narita | G01R 27/2617 333/219.1 |
| 2014/0333329 A1 | 11/2014 | Jeong et al. | |
| 2020/0348359 A1 | 11/2020 | Weiss et al. | |

FOREIGN PATENT DOCUMENTS

| | | | |
|---|---|---|---|
| CN | 1519535 A | 8/2004 | |
| CN | 105716563 A | 6/2016 | |
| TW | M601814 U | 9/2020 | |
| WO | WO-0173451 A1 * | 10/2001 | ......... G01R 1/06772 |

* cited by examiner

*Primary Examiner* — Lee E Rodak
(74) *Attorney, Agent, or Firm* — Karin L. Williams; Alan D. Kamrath; Mayer & Williams PC

(57) ABSTRACT

A method for measuring thickness of dielectric layer in circuit board includes the following steps: First, circuit board including dielectric layer and circuit layers is provided. The dielectric layer is between the circuit layers, and the circuit board further includes test area including test pattern and through hole. The test pattern includes first conductor and second conductors. The distance between the side of the through hole and the second conductor is less than the distance between the side of the through hole and the first conductor. Next, measuring device including conductive pin and sensing element is provided. Next, the conductive pin is powered, and one end of the conductive pin is electrically connected to the second conductor. Next, the sensing element is moved along the through hole to obtain sensing curve, and the thickness of the dielectric layer is calculated via variations of the sensing curve.

7 Claims, 9 Drawing Sheets

DEVICE AND METHOD FOR MEASURING THICKNESS OF DIELECTRIC LAYER IN CIRCUIT BOARD

FIELD OF THE DISCLOSURE

The present invention relates to a device and a method for measuring a thickness of a dielectric layer in a circuit board, and more particularly to the device and the method for measuring the thickness of the dielectric layer in the circuit board using a sensing element.

BACKGROUND OF THE INVENTION

Currently, the thickness of the dielectric layer of the circuit board is mainly measured by destructive methods. For example, partial circuit board must be removed to be a measuring slice, firstly. Next, using optical microscope or scanning electron microscope is to measure the thickness. However, such prior art is very time-consuming and labor-intensive, and it will also damage a larger area of the circuit board and cause the circuit board to be scrapped.

Therefore, how to measure the thickness of the dielectric layer in the circuit board quickly and easily is worth considering for person having ordinary skill in the art.

SUMMARY OF THE INVENTION

The objective of the present invention is to provide a method for measuring a thickness of a dielectric layer in a circuit board. The method for measuring the thickness of the dielectric layer in the circuit board can quickly and easily measure the thickness of the dielectric layer in the circuit board without damaging the circuit board.

The method for measuring the thickness of the dielectric layer in the circuit board in the present invention includes the following steps:

First, a circuit board including at least one dielectric layer and at least two circuit layers is provided. The dielectric layer is between the circuit layers, and the circuit board further includes a test area. The test area includes a test pattern and a through hole. The test pattern includes at least one first conductor and at least two second conductor. The first conductor is between and connected to the two second conductor. The second conductor is a part of the circuit layer. The first conductor penetrates the dielectric layer. The distance between the side of the through hole and the second conductor is less than the distance between the side of the through hole and the first conductor. Next, a measuring device including a conductive pin and a sensing element is provided. The sensing element includes a sensing end, a linking portion and an insulation. Next, the conductive pin is powered, and one end of the conductive pin is electrically connected to the second conductor. Next, the sensing element is moved along the through hole to obtain a sensing curve, and the thickness of the dielectric layer is calculated via variations of the sensing curve.

In the method for measuring the thickness of the dielectric layer in the circuit board, the sensing element is moved along the through hole at a constant velocity.

In the method for measuring the thickness of the dielectric layer in the circuit board, a length of the sensing end is less than a thickness of the second conductor.

In the method for measuring the thickness of the dielectric layer in the circuit board, the sensing element is a capacitive sensing element or an inductive sensing element.

Another objective of the present invention is to provide a measuring device. The measuring device can quickly and easily measure a thickness of a dielectric layer in a circuit board without damaging the circuit board.

The measuring device of the present invention is used to measure a thickness of a dielectric layer of a circuit board. The circuit board includes at least one dielectric layer and at least two circuit layers. The dielectric layer is between the circuit layers. The circuit board further includes a test area. The test area includes a test pattern and a through hole. The test pattern includes at least one first conductor and at least two second conductor. The first conductor is between and connected to the two second conductor. The second conductor is a part of the circuit layer. The first conductor penetrates the dielectric layer. The distance between the side of the through hole and the second conductor is less than the distance between the side of the through hole and the first conductor. The measuring device includes a sensing element and a conductive pin. The sensing element includes a sensing end, a linking portion and an insulation. The linking portion is connected to the sensing end. The linking portion is covered with the insulation. One end of the conductive pin is electrically connected to the second conductor. When the thickness of the dielectric layer is measured, the sensing element is moved along the through hole to obtain a sensing curve.

In the measuring device, the sensing element is a capacitive sensing element or an inductive sensing element.

In the measuring device, the number of layers of the dielectric layer is plural.

The present invention has the following advantages:

Only by forming a through hole in the pre-set test area, the sensing element can be moved to the through hole to measure the thickness of the dielectric layer of each layer in the circuit board. The required area of the circuit board is small.

The foregoing, as well as additional objects, features and advantages of the invention will be more readily apparent from the following detailed description, which proceeds with reference to the accompanying drawings.

DESCRIPTION OF THE PREFERRED EMBODIMENTS

Figure 1:
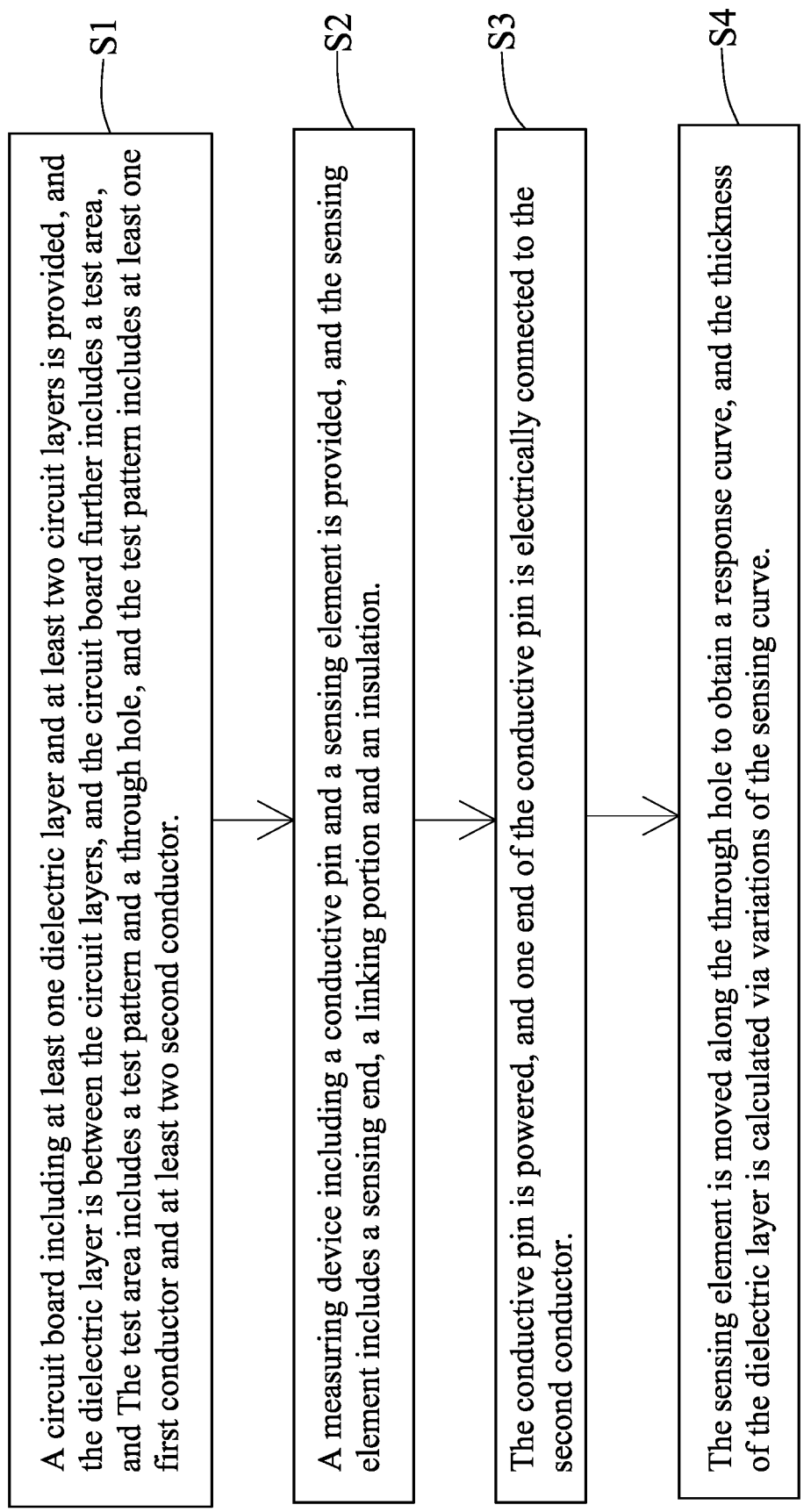
FIG. 1 illustrates a schematic diagram of a method for measuring a thickness of a dielectric layer in a circuit board of the present invention.

Please refer to FIG. 1, which illustrates a schematic diagram of a method for measuring a thickness of a dielectric layer in a circuit board of the present invention. The method for measuring the thickness of the dielectric layer includes the following steps.

Figure 2A:
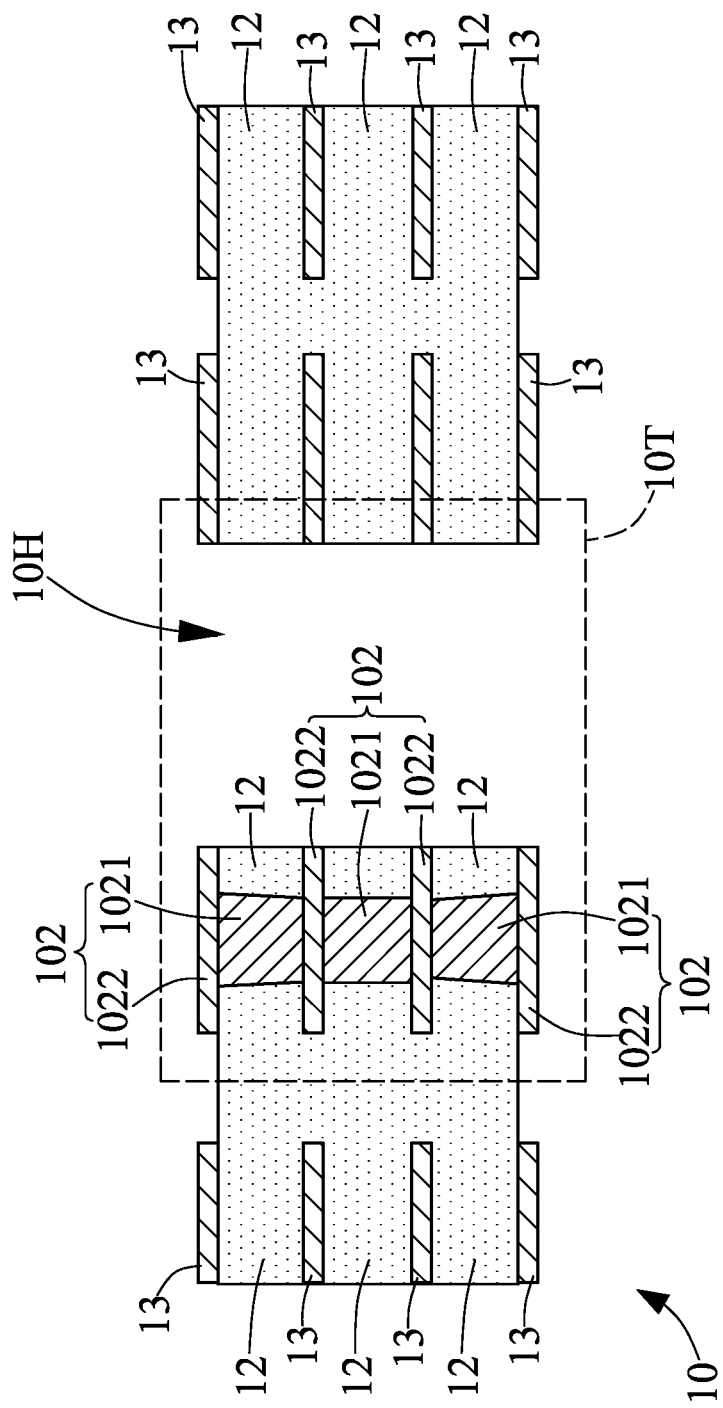
FIG. 2A illustrates a schematic diagram of a circuit board 10.

First, please refer to the step S1 and FIG. 2A. FIG. 2A illustrates a schematic partial cross-sectional view of a circuit board 10 of the present invention. The circuit board 10, including three dielectric layers 12 and four circuit layers 13, is provided. However, a person having ordinary skill in the art should understand that in practice, the circuit board 10 have more of the dielectric layers 12 and the circuit layers 13, or the circuit board 10 may only have one dielectric layer 12 and two circuit layers 13. The dielectric layer 12 is between the two circuit layers 13. In addition, the circuit board 10 further has a test area 10T having a test pattern 102 and a through hole 10H. The test pattern 102 has at least one first conductor 1021 and at least two second conductors 1022. The first conductor 1022 penetrates through the dielectric layer 12. The first conductor 1021 is between the two second conductors 1022 and connects to the two second conductors 1022 respectively.

Furthermore, the second conductors 1022 are parts of the circuit layer 13. In detail, in the manufacturing process of the circuit board 10, the second conductors 1022 and the circuit layer 13 are formed at the same time, and the first conductor 1021 is formed by perforating the dielectric layer 12 and depositing metal. Therefore, the number of the layer of the second conductors 1022 in the embodiment is the same as that of the circuit layer 13, that is four, and the number of the layers of the first conductor 1021 and the dielectric layer 12 are the same (In the embodiment, the number of the layer of the first conductor 1021 is three). In the embodiment, the lateral dimension of the second conductor 1022 is greater than the lateral dimension of the first conductor 1021. That is, the distance between the side of the through hole 10H and the second conductor 1022 is less than the distance between the side of the through hole 10H and the first conductor 1021. Moreover, the dielectric layer 12 and the second conductor 1022 appears on the side surface of the through hole 10H.

Figure 2B:
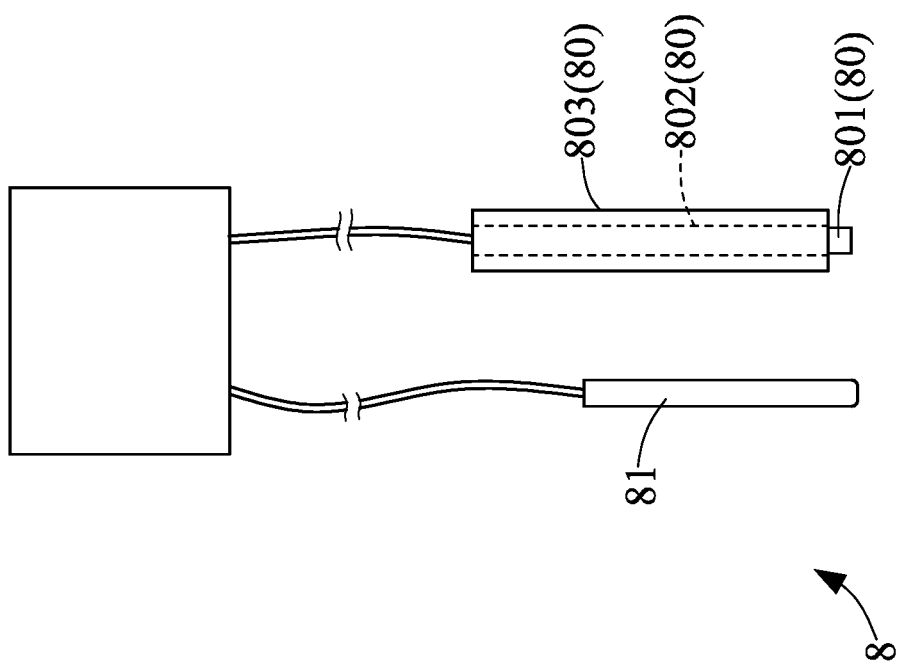
FIG. 2B illustrates a schematic diagram of a measuring device 8.

Next, please refer to the step S2 and FIG. 2B. FIG. 2B illustrates a schematic view of a measuring device 8 of the present invention. The measuring device 8 including a conductive pin 81 and a sensing element 80 is provided. The sensing element 80 can be a capacitive sensing element. The sensing element 80 includes a sensing end 801, a linking portion 802 and an insulation 803. The linking portion 802 is connected to the sensing end 801. The linking portion 802 is wrapped around by the insulation 803. One of the embodiments appears that the length of the sensing end 801 is less than the thickness of the second conductor 1022. Therefore, the sensing end 801 can precisely detect variations of the capacitance value. For the embodiment, the conductive pin 81 and the sensing end 801 of the sensing element 80 are in the same electronic circuit. The conductive pin 81 connects to the positive pole of the measuring device 8, and the sensing element 80 connects to the negative pole of the measuring device 8.

Figure 2C:
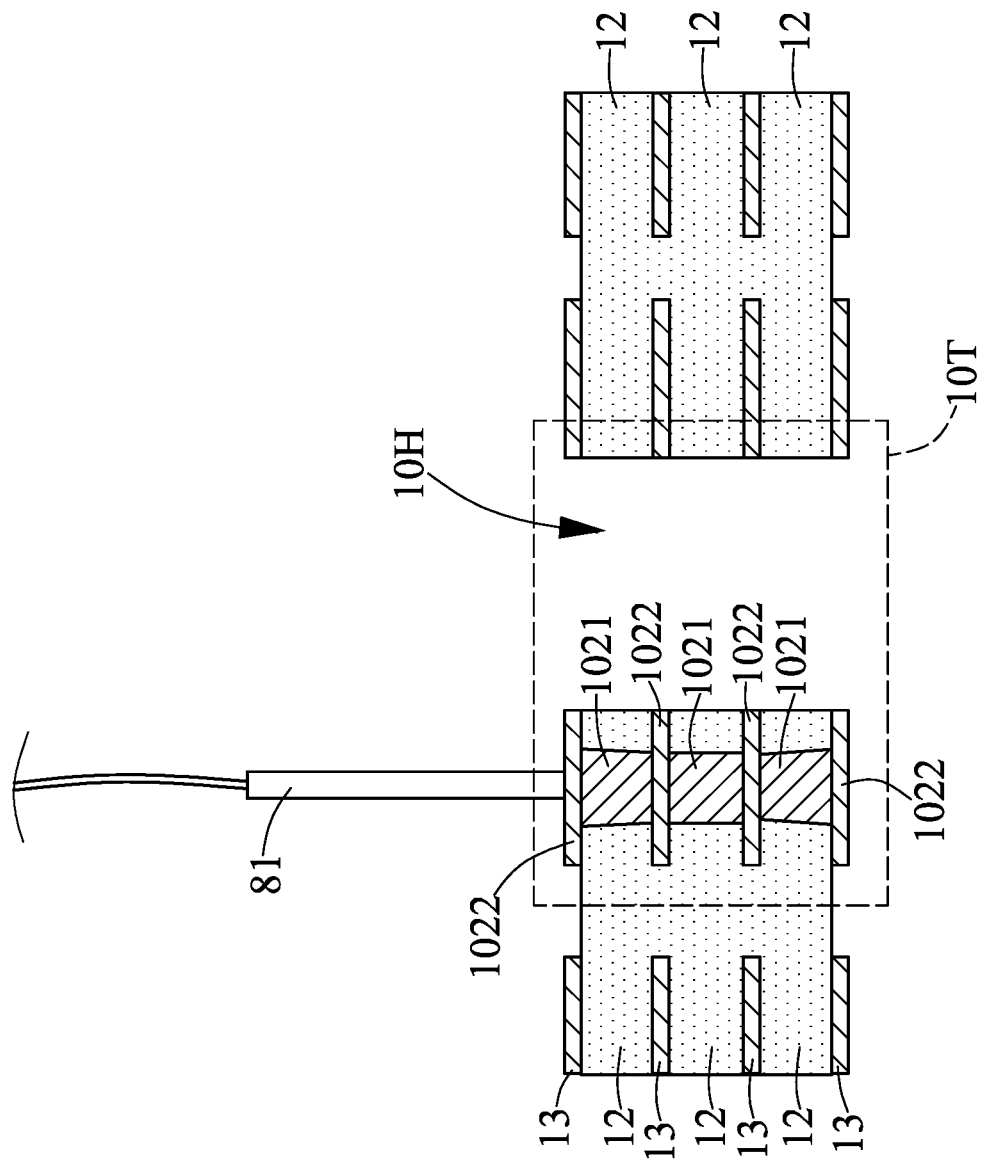
FIG. 2C illustrates a schematic diagram of a conductive pin 81 connected to a second conductor 1022.

Continuously, please refer to the step S3 and FIG. 2C. FIG. 2C illustrates a schematic view of the conductive pin 81 connecting to the second conductor 1022 of the present invention. The conductive pin 81 is powered, and one end of the conductive pin 81 electrically connects to the uppermost second conductor 1022. Of course, one end of the conductive pin 81 can also electrically connect to the lowermost second conductor 1022. The first conductor 1021 electrically connects to the second conductor 1022, so that the first conductor 1021 and the second conductor 1022 may be the same electrical characteristic as the conductive pin 81 (e.g., positive electricity); on the contrary, the electrical characteristic of the sensing element 80 is different from the conductive pin 81's (e.g., negative electricity). Therefore, capacitances are generated between the sensing element 80 and the first conductor portion 1021 and between the sensing element 80 and the second conductor portion 1022.

Figure 3A:
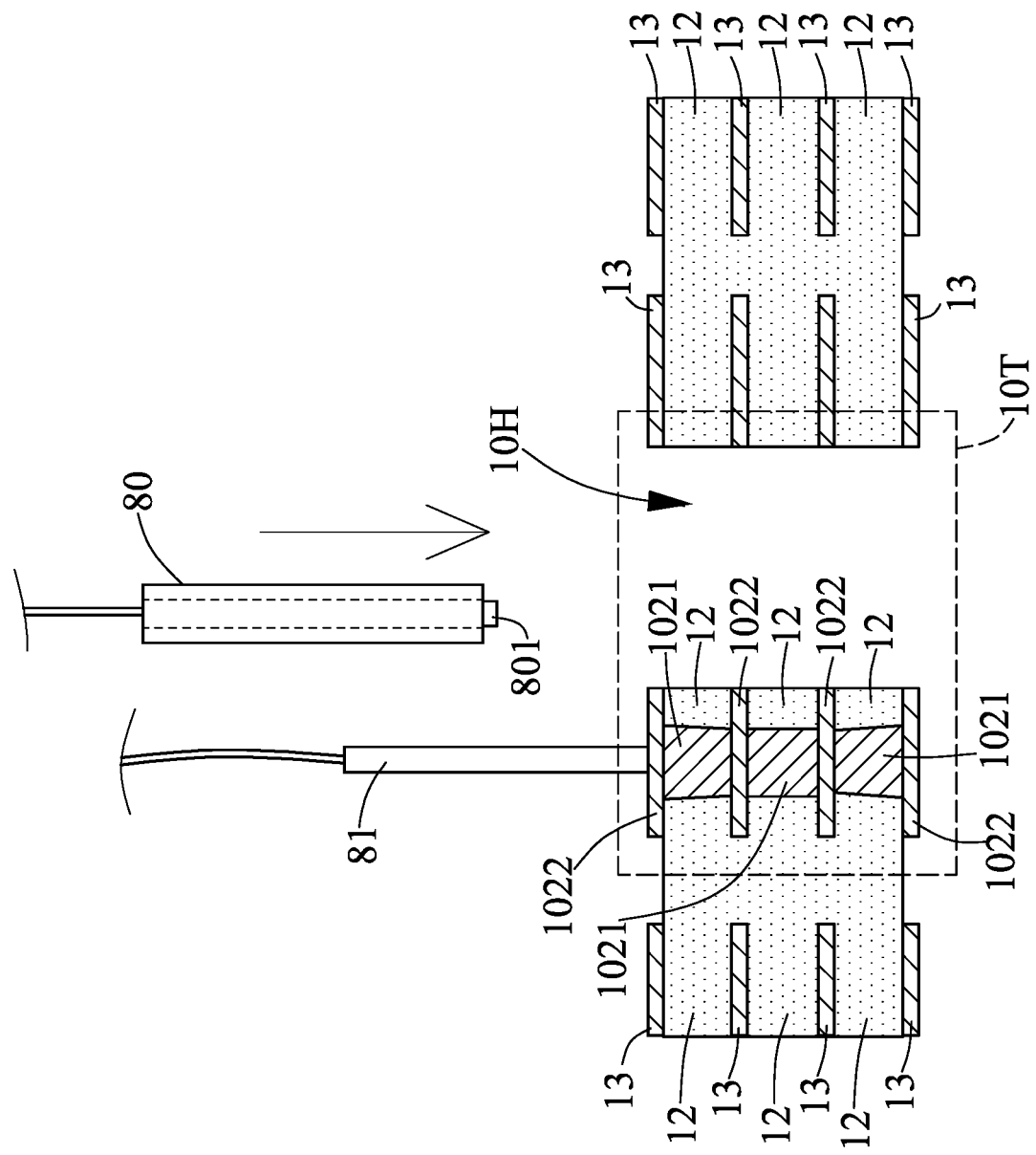
FIG. 3A illustrates a schematic diagram of a sensing element 80 being about to enter a through hole 10H.
Figure 3B:
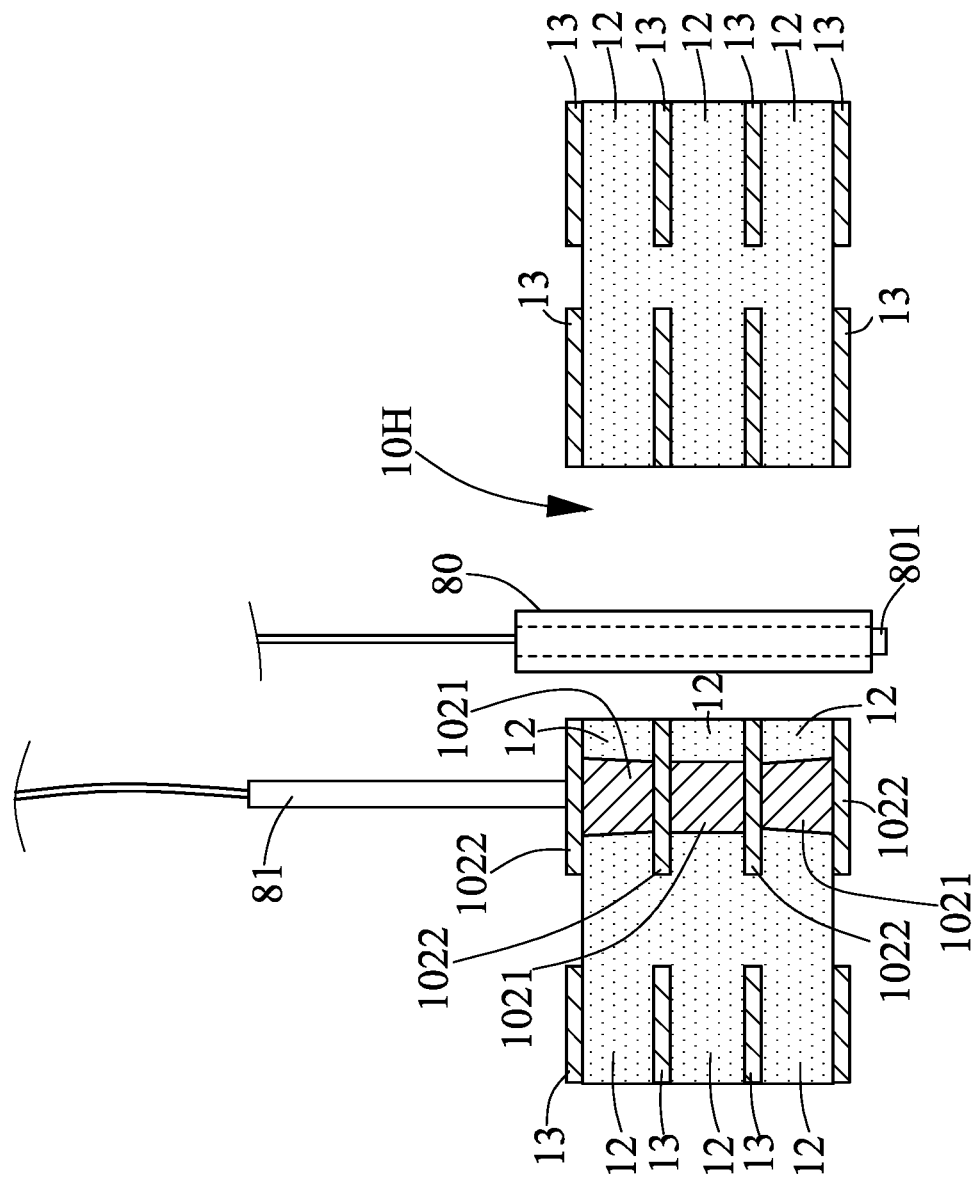
FIG. 3B illustrates a schematic diagram of a sensing end 801 moving to the bottom of the through hole 10H.
Figure 3C:
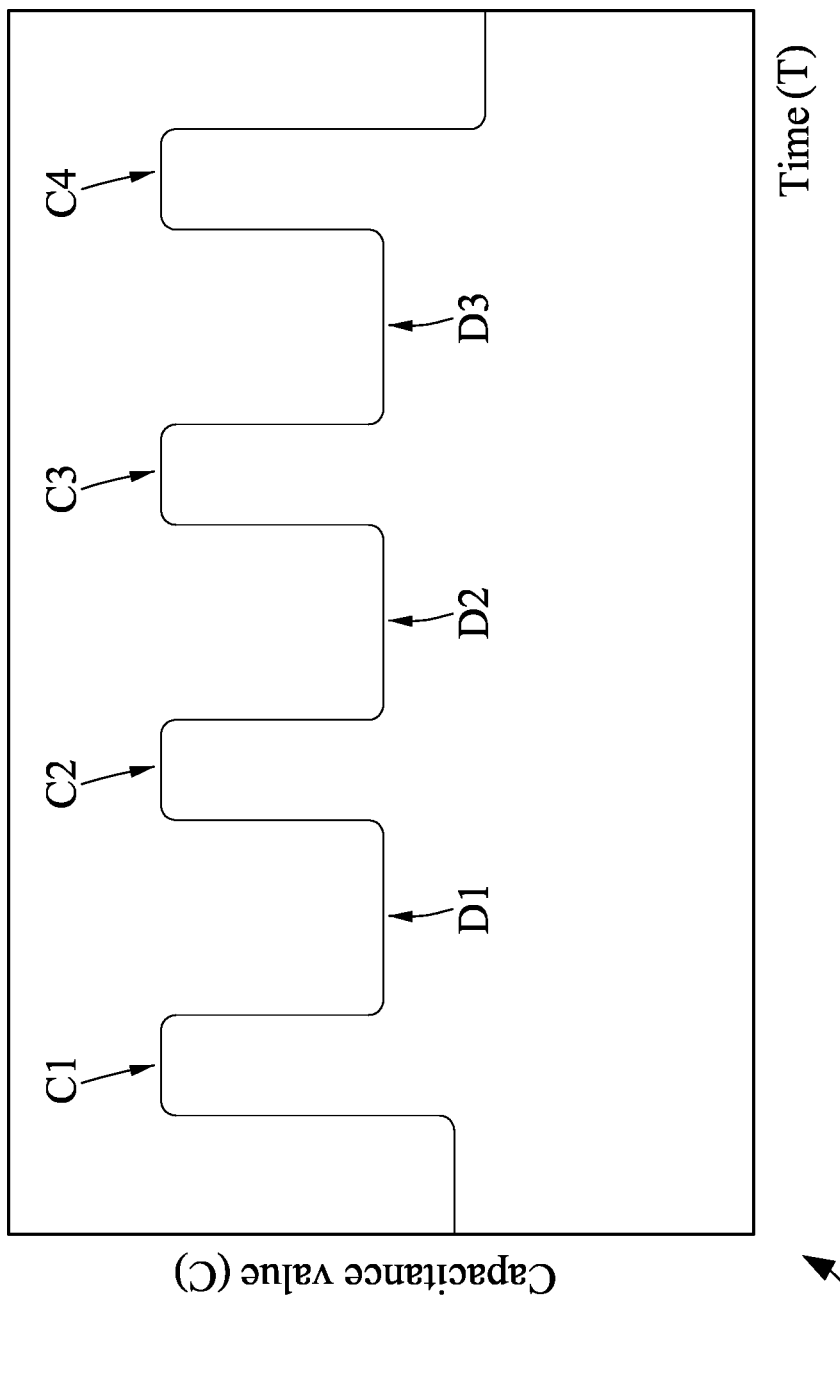
FIG. 3C illustrates a schematic diagram of a sensing curve 80C obtained by the sensing element 80 of FIG. 3B.

Please refer to the step S4. The sensing element 80 moves along the through hole 10H to obtain a sensing curve 80C. The thickness of the dielectric layer 12 is calculated via variations of the sensing curve 80C. The detailed description is as follows:

First, please refer to FIG. 3A, FIG. 3B and FIG. 3C. FIG. 3A illustrates a schematic diagram of a sensing element 80 being about to enter a through hole 10H. FIG. 3B illustrates a schematic view of the sensing end 801 moving to the bottom of the through hole 10H. FIG. 3C illustrates a schematic view of the sensing curve 80C obtained by the sensing element 80 in FIG. 3B. In FIG. 3A, the sensing element 80 moves downward in a constant velocity into the through hole 10H. In FIG. 3B, the sensing end 801 then moves to the bottom of the through hole 10H. During the movements of the sensing element 80, the capacitance values of each layer of the first conductor 1021 and the second conductor 1022 are measured by the sensing element 80. In addition, during the measurement process, the second conductor 1022 is closer to the sensing end 801, as it can be seen, the capacitance value of the second conductor 1022 is greater than the capacitance value of the first conductor 1021.

For example, the capacitance value of the uppermost second conductor 1022 corresponds to the peak curve C1 in FIG. 3C. The capacitance value of the second conductor 1022 of the second layer corresponds to the peak curve C2 in FIG. 3C. The capacitance value of the second conductor 1022 of the third layer corresponds to the peak curve C3 in FIG. 3C. The capacitance value of the second conductor 1022 of the fourth layer corresponds to the peak curve C4 in FIG. 3C. Besides, a valley curve D1 is between the peak curve C1 and the peak curve C2, and the vertical coordinate of the valley curve D1 corresponds to the capacitance value of the uppermost first conductor 1021. Similarly, a valley curve D2 is between the peak curve C2 and the peak curve C3, and the vertical coordinate of the valley curve D2 corresponds to the capacitance value of the first conductor 1021 of the second layer. A valley curve D3 is between the peak curve C3 and the peak curve C4, and the vertical coordinate of the valley curve D3 corresponds to the capacitance value of the lowermost first conductor 1021.

In the embodiment, the width of each peak curve C1, C2, C3, and C4 and each valley curve D1, D2, D3, and D4 represents respectively the time (t) required by that of the sensing end 801 passing through the second conductor 1022 and the first conductor 1021. By measuring the width (i.e., the time (t)) of the valley curve and considering the moving speed (v) of the sensing element 80, the thickness of each dielectric layer 12 (d, d=v×t) can be obtained. In the same way, by measuring the width of the peak curve C1, C2, C3, and C4 and considering the moving speed (v) of the sensing element 80, the thickness of each circuit layer 13 can also be known. In one of the embodiments, the sensing element 80 is moved along the through hole 10H at a constant velocity.

In the embodiment, the sensing element 80 is a capacitive sensing element. However, in other embodiments, the sensing element 80 may be an inductive sensing element. The inductive sensing element measures the inductance values of the first conductor 1021 and the second conductor 1022. In other words, when the sensing element 80 moves into the through hole 10H, a sensing curve 80H is thus gained via the inductance value of a test pattern 102 measured by the sensing element 80 (FIG. 4 illustrates a schematic view of the sensing curve 80H of the present invention).

Figure 4:
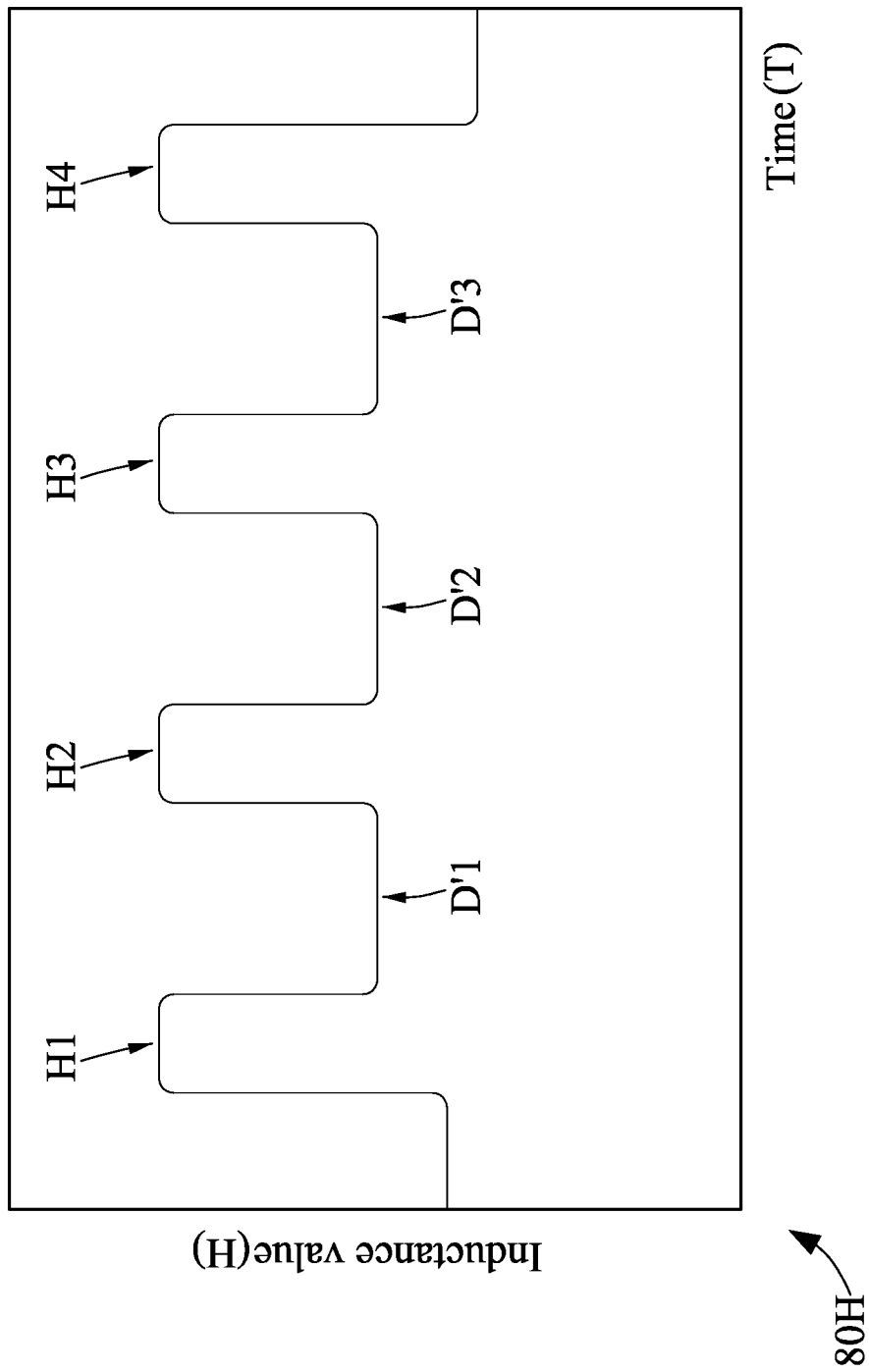
FIG. 4 illustrates a schematic diagram of a sensing curve 80H.

In FIG. 4, the inductance value of the uppermost second conductor 1022 corresponds to the peak curve H1. The inductance value of the second conductor 1022 of the second layer agrees with to the peak curve H2. The inductance value of the second conductor 1022 of the third layer is congruous to the peak curve H3. The inductance value of the second conductor 1022 of the fourth layer is homologous to the peak curve H4. Additionally, the vertical coordinate of the valley curve D'1 is congruous to the inductance value of the uppermost first conductor 1021. The vertical coordinate of the valley curve D'2 corresponds to the inductance value of the first conductor 1021 of the second layer. The vertical coordinate of the valley curve D'3 is homologous to the inductance value of the lowermost first conductor 1021. By measuring the width (i.e., the time (t)) of the valley curve D'1, D'2 and D' 3 and considering the moving speed (v) of the sensing element 80, the thickness of each dielectric layer 12 (d, d=v×t) is gained. In the same way, by measuring the width of the peak curve H1, H2, H3, and H4 and considering the moving speed (v) of the sensing element 80, the thickness of each circuit layer 13 is thus known.

Figure 5:
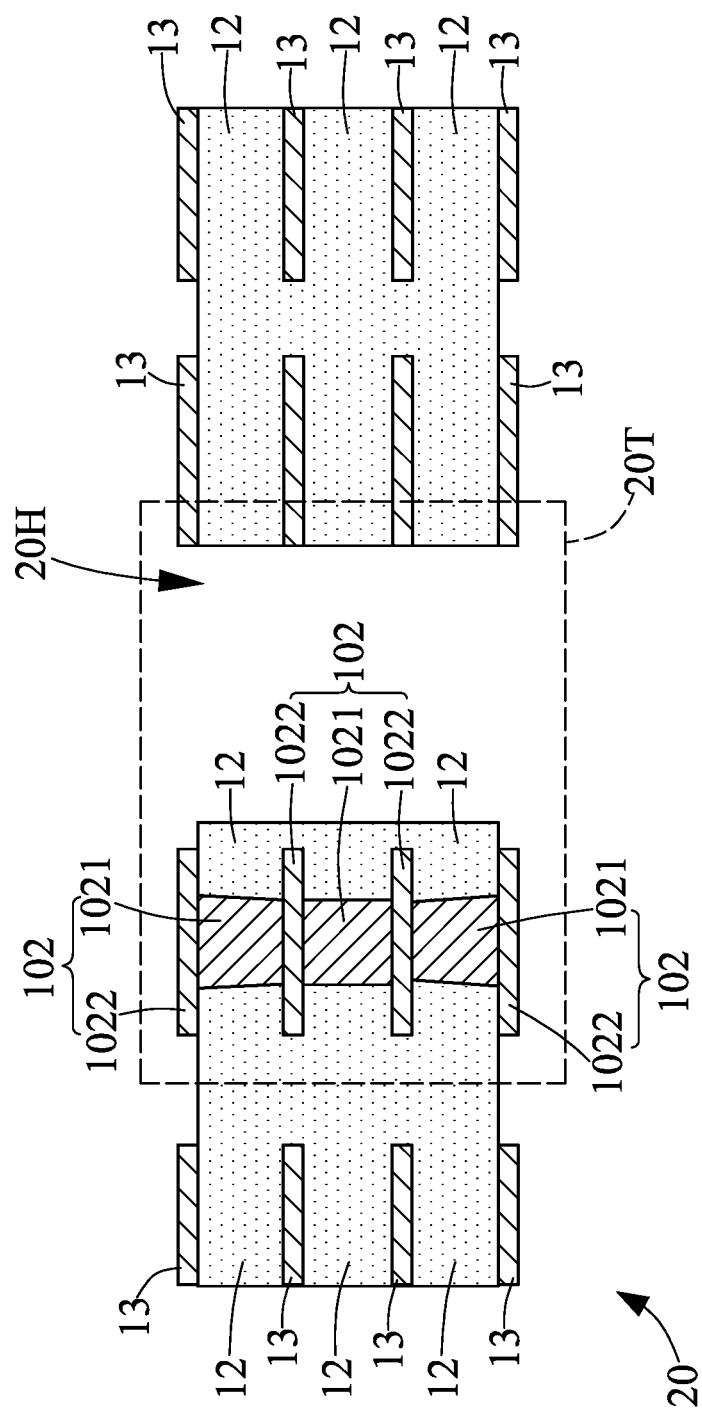
FIG. 5 illustrates a schematic diagram of a partial cross section of a circuit board 20.

Please compare FIG. 5 with FIG. 2C. FIG. 5 illustrates a schematic partial cross-sectional view of a circuit board 20 of another embodiment of the present invention. In the test area 10T of the circuit board 10 of the embodiment in FIG. 2C, all the second conductors 1022 appears on the side surface of the through hole 10H. However, FIG. 5 shows that the second conductors 1022 of the second layer and the third layer of the test area 20T of the circuit board 20 are wrapped around by the dielectric layer 12, so the second conductors 1022 are not appeared over the side surface of the through hole 20H. Furthermore, in FIG. 5, the distance between the side of the through hole 20H and the second conductor 1022 is less than the distance between the side of the through hole 20H and the first conductor 1021. Therefore, moving the sensing element 80 downward along the through hole 20H is able to obtain the sensing curve 80C of FIG. 3C.

In summary, the present invention only needs to form a through hole 10H in the pre-set test area 10T, the sensing element 80 is able to move into the through hole 10H to measure the thickness of the dielectric layer 12 of each layer in the circuit board 10, 20, since the required area to be tested is small and conveniently tested. Therefore, compared to the prior arts, the present invention can quickly and easily measure the thickness of the dielectric layer in the circuit board without damaging the circuit board.

Although the description above contains many specifics, these are merely provided to illustrate the invention and should not be construed as limitations of the invention's scope. Thus, it will be apparent to those skilled, in the art that various modifications and variations can be made in the system and processes of the present disclosure without departing from the spirit or scope of the invention.

What is claimed is:

1. A method for measuring a thickness of a dielectric layer in a circuit board comprising:
   providing the circuit board comprising at least the dielectric layer and at least two circuit layers, the dielectric layer being between the circuit layers, the circuit board further comprising a test area that comprises a test pattern and a through hole, the test pattern having at least one first conductor and at least two second conductors, the first conductor being between and connecting to the two second conductors, the second conductors being parts of the circuit layer, the first conductor penetrating the dielectric layer, wherein a distance between a side of the through hole and the second conductor is less than a distance between the side of the through hole and the first conductor;
   providing a measuring device comprising a conductive pin and a sensing element, the sensing element having a sensing end, a linking portion and an insulation, wherein the linking portion connects to the sensing end, and the insulation wraps around the linking portion;
   powering the conductive pin, one end of the conductive pin electrically connecting to the second conductor; and
   moving the sensing element along the through hole to obtain a sensing curve, so as to calculate the thickness of the dielectric layer calculated via variations of the sensing curve.

2. The method for measuring the thickness of the dielectric layer in the circuit board of claim 1, wherein the sensing element is moved along the through hole at a constant velocity.

3. The method for measuring the thickness of the dielectric layer in the circuit board of claim 1, wherein a length of the sensing end is less than a thickness of the second conductor.

4. The method for measuring the thickness of the dielectric layer in the circuit board of claim 1, wherein the sensing element is a capacitive sensing element or an inductive sensing element.

5. A measuring device for measuring a thickness of a dielectric layer of a circuit board, the circuit board comprising at least one dielectric layer and at least two circuit layers, the dielectric layer being between the circuit layers, the circuit board further comprising a test area that comprises a test pattern and a through hole, the test pattern having at least one first conductor and at least two second conductors, the first conductor being between and connecting to the two second conductors, the second conductors being parts of the circuit layer, the first conductor penetrating the dielectric layer, wherein distance between a side of the through hole and the second conductor is less than a distance between the side of the through hole and the first conductor, the measuring device comprising:
   a sensing element, comprising:
      a sensing end;
      a linking portion, connecting to the sensing end; and
      an insulation, wrapping around the linking portion; and
   a conductive pin, one end of the conductive pin electrically connecting to the second conductor;
   wherein when the thickness of the dielectric layer is measured, the sensing element moves along the through hole to obtain a sensing curve.

6. The measuring device of claim 5, wherein the sensing element is a capacitive sensing element or an inductive sensing element.

7. The measuring device of claim 5, wherein a number of layers of the dielectric layer is plural.

* * * * *